(12) United States Patent
Cheng et al.

(10) Patent No.: US 7,949,085 B2
(45) Date of Patent: May 24, 2011

(54) STRESSLESS SHIFT REGISTER

(75) Inventors: Kuo-hsing Cheng, Hsin-Chu (TW);
Ming-sheng Lai, Hsin-Chu (TW);
Chih-yuan Chien, Hsin-Chu (TW);
Yu-ju Kuo, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 954 days.

(21) Appl. No.: 11/763,040

(22) Filed: Jun. 14, 2007

(65) Prior Publication Data

US 2008/0042965 A1 Feb. 21, 2008

(30) Foreign Application Priority Data

Jun. 29, 2006 (TW) ................................ 95123684 A

(51) Int. Cl.
*G11C 19/00* (2006.01)

(52) U.S. Cl. ............... 377/64; 377/78; 377/76; 345/100

(58) Field of Classification Search .................. None
See application file for complete search history.

(56) References Cited

U.S. PATENT DOCUMENTS

| | | |
|---|---|---|
| 5,222,082 A | 6/1993 | Plus |
| 5,410,583 A | 4/1995 | Weisbrod et al. |
| 5,434,899 A | 7/1995 | Huq et al. |
| 5,517,542 A | 5/1996 | Huq |
| 5,701,136 A | 12/1997 | Huq et al. |
| 6,690,347 B2 | 2/2004 | Jeon et al. |
| 6,747,627 B1 | 6/2004 | Koyama et al. |
| 6,845,140 B2 | 1/2005 | Moon et al. |
| 2005/0185752 A1 | 8/2005 | Sasaki et al. |
| 2007/0086558 A1* | 4/2007 | Wei et al. ................... 377/64 |

FOREIGN PATENT DOCUMENTS

| | | |
|---|---|---|
| EP | 0696803 A2 | 2/1996 |
| TW | 200400516 A | 1/2004 |
| TW | 227451 B | 2/2005 |

OTHER PUBLICATIONS

Jpn. J. Appl. Phys. vol. 37(1998) pp. 4704-4710.

* cited by examiner

*Primary Examiner* — Bipin Shalwala
*Assistant Examiner* — Kelly Hegarty

(57) ABSTRACT

A shift register unit includes a plurality of register units electrically coupled in cascade. Each register unit outputs an output pulse according to a first clock signal, a second clock signal and an output pulse of a previous register unit. Each register unit includes a first switch unit, a second switch unit, a third switch unit, a fourth switch unit, and a driving unit. The first switch unit is used for conducting the input pulse to a first node when the first switch is turned on. The second switch unit is used for conducting the output pulse of the register unit according to the first clock signal to an output end when the second switch unit is turned on in response to the input pulse. The third switch unit electrically coupled to a supply end is used for conducting a supply voltage to the output end when the second switch unit is turned off. The fourth switch unit electrically coupled to the supply end is used for conducting the supply voltage to the first node when the fourth switch unit is turned on in response to a driving pulse. The driving unit is used for providing the driving pulse according to the first clock signal, the second clock signal, and the input pulse.

11 Claims, 11 Drawing Sheets

STRESSLESS SHIFT REGISTER

BACKGROUND OF THE INVENTION

1. Field of the Invention

The present invention relates to a shift register, and more particularly, to a shift register capable of reducing the voltage stress effect.

2. Description of the Related Art

Liquid crystal displays, on account of their high resolution requirement, are widely applied to various electronic devices, such as mobile phones, personal digital assistants, digital cameras, computer displays, and notebook computer displays.

FIG. 1 shows a functional block diagram of a conventional liquid crystal display 10. The liquid crystal display 10 includes a liquid crystal panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains 1024×768×3 pixel units 20. The gate driver 14 periodically outputs a scanning signal to turn on each transistor 22 of the pixel units 20 row by row, meanwhile, each pixel units 20 is charged to a corresponding voltage based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row. Sequentially, until all pixel units 20 of the liquid crystal panel 12 finish charging, and the gate driver 14 outputs the scanning signal to the first row again and repeats the above-mentioned mechanism.

As to the conventional liquid crystal display, the gate driver 14 functions as a shift register. In other words, the gate driver 16 outputs a scanning signal to the liquid crystal display 12 at a fixed interval. For instance, a liquid crystal display 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Unfortunately, regarding the gate driver 14 manufactured with an amorphous silicon (a-Si) technology, the liquid crystal display 12 may display unevenly due to a voltage stress phenomenon which causes a discrepancy of threshold voltages of any two transistors. FIG. 2 is a block diagram of a shift register disclosed in U.S. Pat. No. 5,222,082. FIG. 3 is a circuit diagram of the shift register as shown in FIG. 2. FIG. 4 is a timing diagram of each node as shown in FIG. 3. The shift register 30 includes a plurality of shift register units 31 electrically coupled in cascade. Each shift register unit 31 is used for delaying an input signal INPUT from an input end 32 and outputting an output signal OUTPUT1 to a output end 33, based on clock signals C1, C2, and C3 of the clock generator 38. Then the next register unit 31 delays the output signal OUTPUT1 of the previous register unit 3, and thus outputs an output signal OUTPUT2. Referring to FIG. 4, the output signal OUTPUT of each register unit 31 is a delay of the input signal INPUT. However, as range A shown in FIG. 4, voltage applied at gates (i.e. node P2) of transistors 17 and 19 of each register unit 31 may keep a high voltage level for a long while until next scanning period for the next frame. In this way, the gate voltage Vg applied to the transistors 17 and 19 results in a voltage shift.

FIG. 5 is a chart illustrating a relationship between the gate voltage and the drain current corresponding to various voltage stresses. FIG. 5 is cited based on the content of Japan. Journal of Applied Physics Vol. 37 (1998) pp. 4704-4710. When the transistor is under a positive voltage stress, the longer the stress time is, the greater the shift range of threshold voltage Vth of the transistor is. However, the stress time of the positive voltage stress may degrade operation efficiency and reduce the life of the transistor, even shorten the life of the whole shift register.

In order to reduce the damage of the transistor caused by the voltage stress phenomenon that the high voltage level is applied at the gate of the transistor for a long while, a resolution is to shorten a time period over which the high voltage level is applied at the gate of the transistor.

Referring to FIGS. 6 and 7, FIG. 6 is a block diagram of a shift register disclosed in U.S. Pat. No. 5,517,542, and FIG. 7 is a block diagram of a shirt register disclosed in U.S. Pat. No. 6,845,140. In FIG. 6, the delay output of the Nth stage shift register unit 42 is controlled by the output $OUT_{n+2}$ of the (N+2)th stage shift register unit 42. In FIG. 7, the delay output of the Nth stage shift register unit $SR_N$ is controlled by the output $GOUT_{N+1}$ of the (N+1)th stage shift register unit $SR_{N+1}$. In other words, a transition of the gate voltage of the current transistor from the high voltage level to the low voltage level is determined by the output signal of the next stage or the next two stage shift register unit of such two shift registers, so that the voltage applied on the gate of the transistor does not keep the high voltage level for a long time, thereby reducing voltage stress phenomenon for the transistor. Because such two shift register units utilize the output signal of next stage or next two stage shift register units as a control signal to adjust the transition of the gate voltage of the transistor of the current shift register unit, the signal interference inevitably occurs.

SUMMARY OF THE INVENTION

It is therefore an object of the present invention to provide a shift register for reducing voltage stress, which an operational lifetime of the transistor is not only increased, but signal interference is reduced, thereby effectively solving the above-mentioned problem existing in the prior art.

The shift register unit comprises n register units electrically coupled in cascade, where n is equal to or greater than 3. Each register unit outputs an output pulse according to a first clock signal, a second clock signal, and an input pulse, wherein the input pulse of a first one of the n register units comprises a start trigger pulse, and wherein the input pulse of the second to the $n^{th}$ register units comprises the output pulse of a preceding one of the first to the $(n-1)^{th}$ register units, respectively. Each register unit comprises a first switch unit, a second switch unit, a third switch unit, a fourth switch unit, and a driving unit. The first switch unit is used for conducting the input pulse to a first node when the first switch is turned on. The second switch unit is used for conducting the output pulse of the register unit according to the first clock signal to an output end when the second switch unit is turned on in response to the input pulse. The third switch unit electrically coupled to a supply end is used for conducting a supply voltage to the output end when the second switch unit is turned off. The fourth switch unit electrically coupled to the supply end is used for conducting the supply voltage to the first node when the fourth switch unit is turned on in response to a driving pulse. The driving unit is used for providing the driving pulse according to the first clock signal, the second clock signal, and the input pulse.

In one aspect of the present invention, the shift register further comprises a fifth switch unit electrically coupled to the supply end, for conducting the supply voltage to the output end when the fifth switch unit is tuned on in response to the driving pulse.

In another aspect of the present invention, the driving unit comprises a first subtract circuit, a second subtract circuit, a sixth switch unit, a seventh switch unit, an eighth switch unit, and a ninth switch unit. The first subtract circuit is used for producing a first modulation signal according to the second clock signal and the input pulse. The second subtract circuit is used for producing a second modulation signal according to the first clock signal and the output pulse. The sixth switch unit is used for conducting the input pulse to a second node when the sixth switch unit is turned on. The seventh switch unit is used for conducting the first modulation signal to a third node to generate the driving pulse when the seventh switch unit is turned on. The eighth switch unit, electrically coupled to the supply end, is used for conducting the supply voltage to the third node when the seventh switch unit is turned off. The ninth switch unit, electrically coupled to the supply end, is used for conducting the supply voltage to the second node when the ninth switch unit is turned on according to the second modulation signal.

According to the present invention, a register unit for delaying an input pulse received at an input end and outputting an output pulse at an output end is provided. The register unit comprises a first switch unit, a second switch unit, a third switch unit, a fourth switch unit, and a driving unit. The first switch unit is used for conducting the input pulse to a first node when the first switch unit is turned on. The second switch unit is used for conducting the output pulse according to a first clock signal to the output end when the second switch unit is turned on in response to the input pulse. The third switch unit electrically coupled to a supply end is used for conducting a supply voltage to the output end when the second switch unit is turned off. The fourth switch unit electrically coupled to the supply end is used for conducting the supply voltage to the first node when the fourth switch unit is turned on in response to a driving pulse. The driving unit is used for providing the driving pulse to turn on the fourth switch unit according to the first clock signal, a second clock signal, and the input pulse.

In one aspect of the present invention, the driving unit comprises a first subtract circuit, a second subtract circuit, a sixth switch unit, a seventh switch unit, an eighth switch unit, and a ninth switch unit. The first subtract circuit is used for producing a first modulation signal according to the second clock signal and the input pulse. The second subtract circuit is used for producing a second modulation signal according to the first clock signal and the output pulse. The sixth switch unit is used for conducting the input pulse to a second node when the sixth switch unit is turned on. The seventh switch unit is used for conducting the first modulation signal to a third node to generate the driving pulse when the seventh switch unit is turned on. The eighth switch unit, electrically coupled to the supply end, is used for conducting the supply voltage to the third node when the seventh switch unit is turned off. The ninth switch unit, electrically coupled to the supply end, is used for conducting the supply voltage to the second node when the ninth switch unit is turned on according to the second modulation signal.

These and other objectives of the present invention will become apparent to those of ordinary skill in the art after reading the following detailed description of the preferred embodiment that is illustrated in the various figures and drawings.

DESCRIPTION OF THE DRAWINGS

Figure 1:
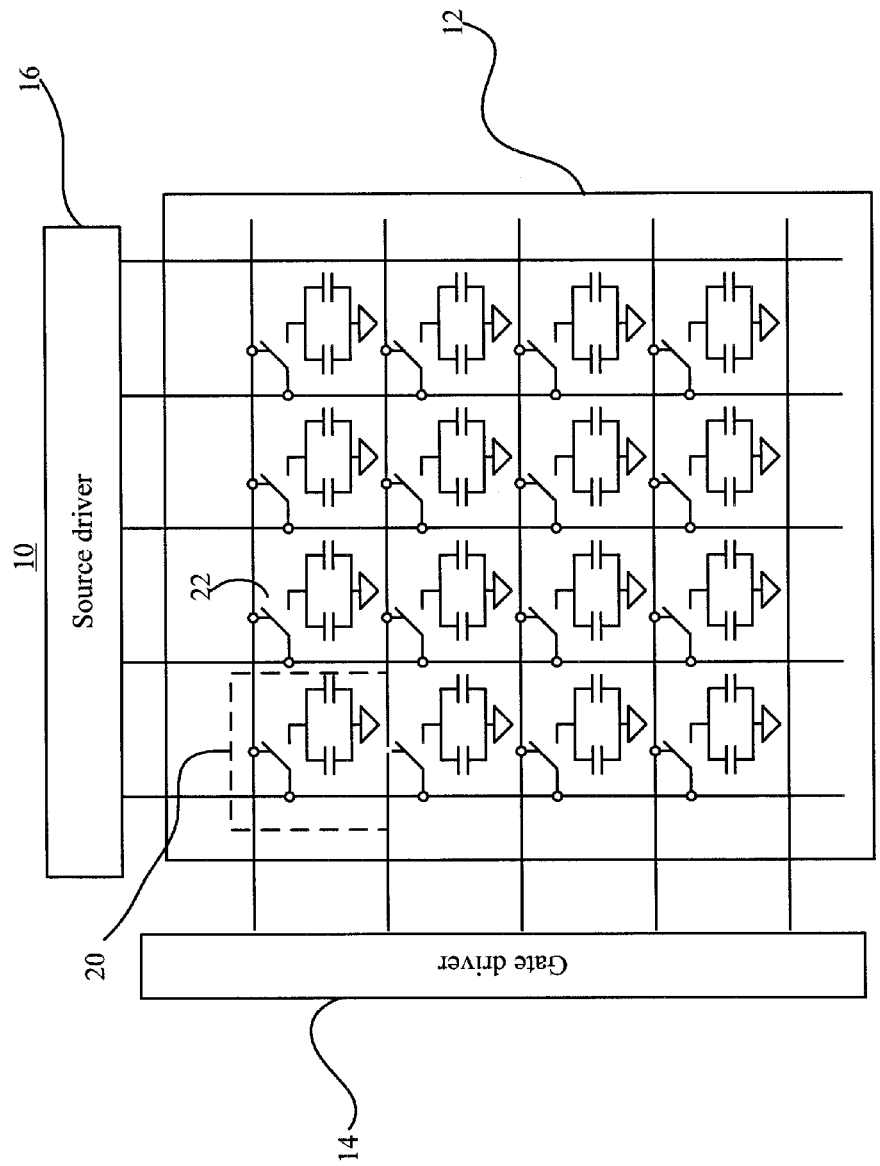
FIG. 1 is a block diagram of a conventional liquid crystal display.
Figure 2:
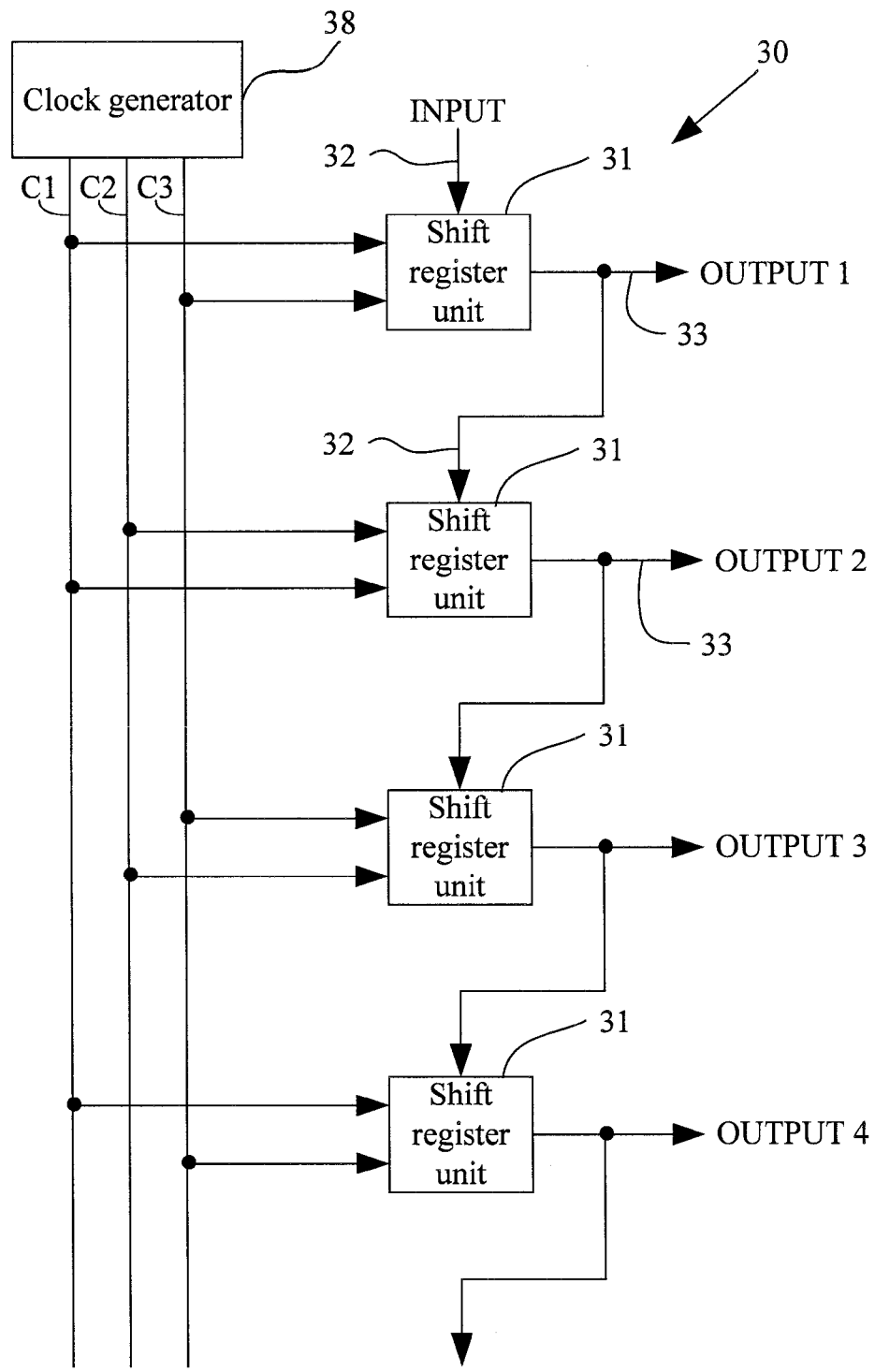
FIG. 2 is a block diagram of the shift register disclosed in U.S. Pat. No. 5,222,082.
Figure 3:
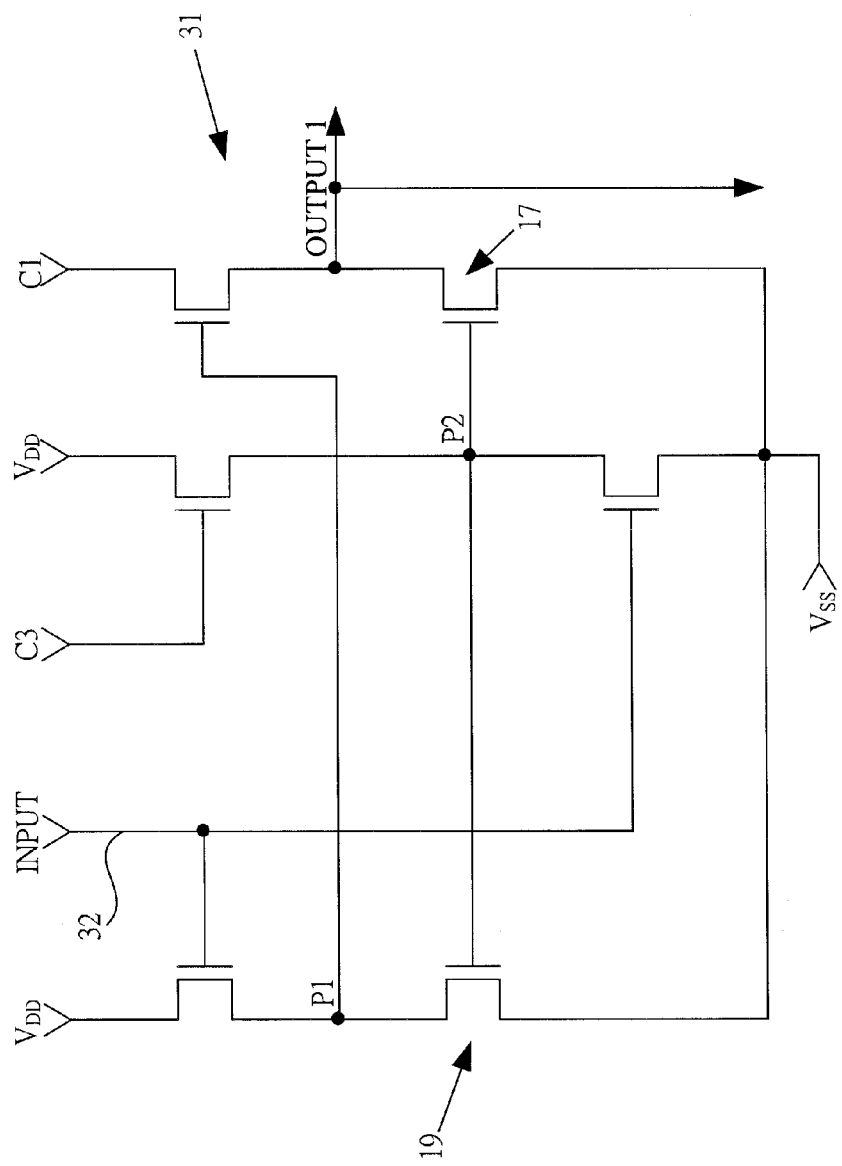
FIG. 3 is a circuit diagram of the shift register unit as shown in FIG. 2.
Figure 4:
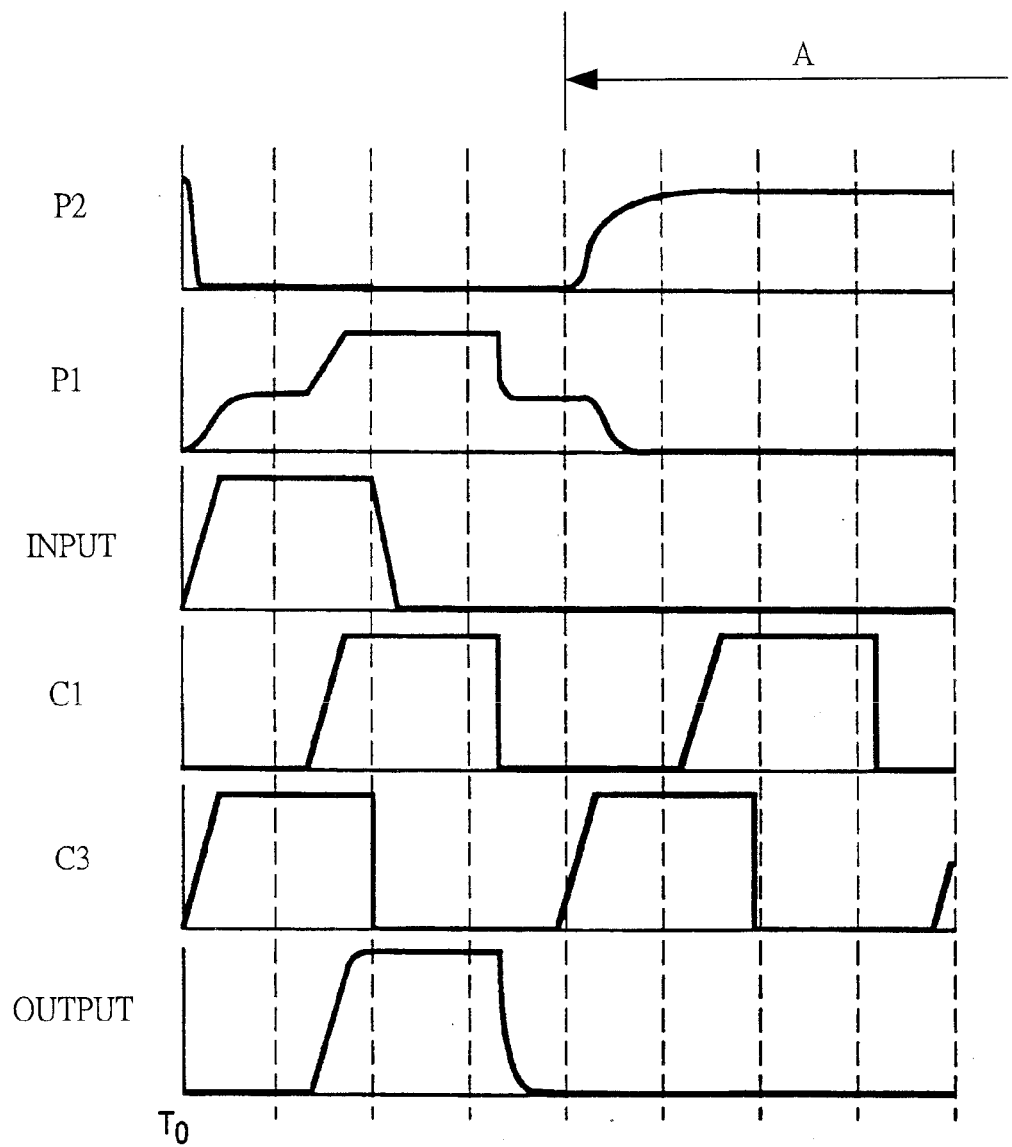
FIG. 4 is a signal time diagram of each node as shown in FIG. 3.
Figure 5:
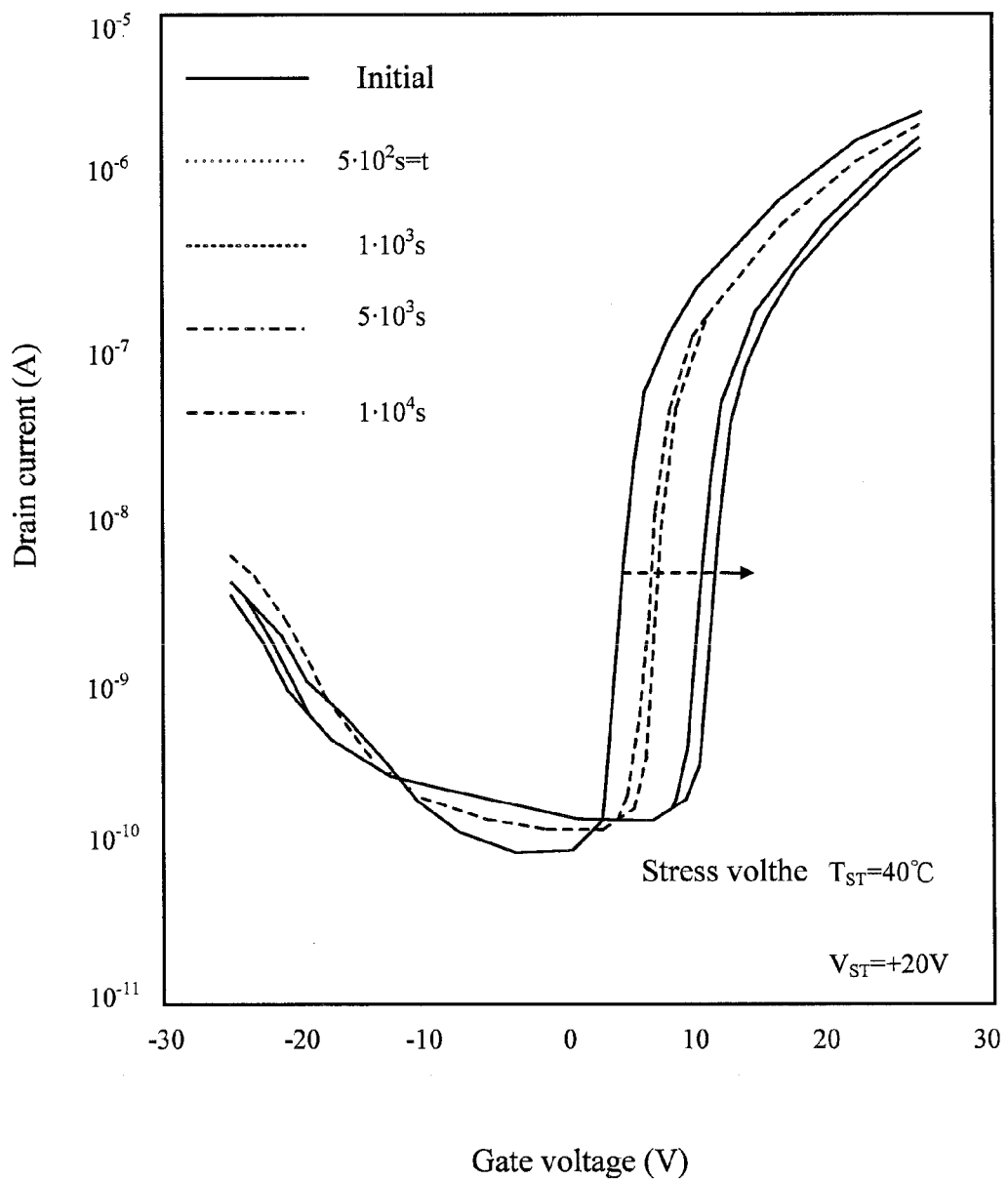
FIG. 5 is a chart illustrating a relationship between the gate voltage and the drain current corresponding to various voltage stress.
Figure 6:
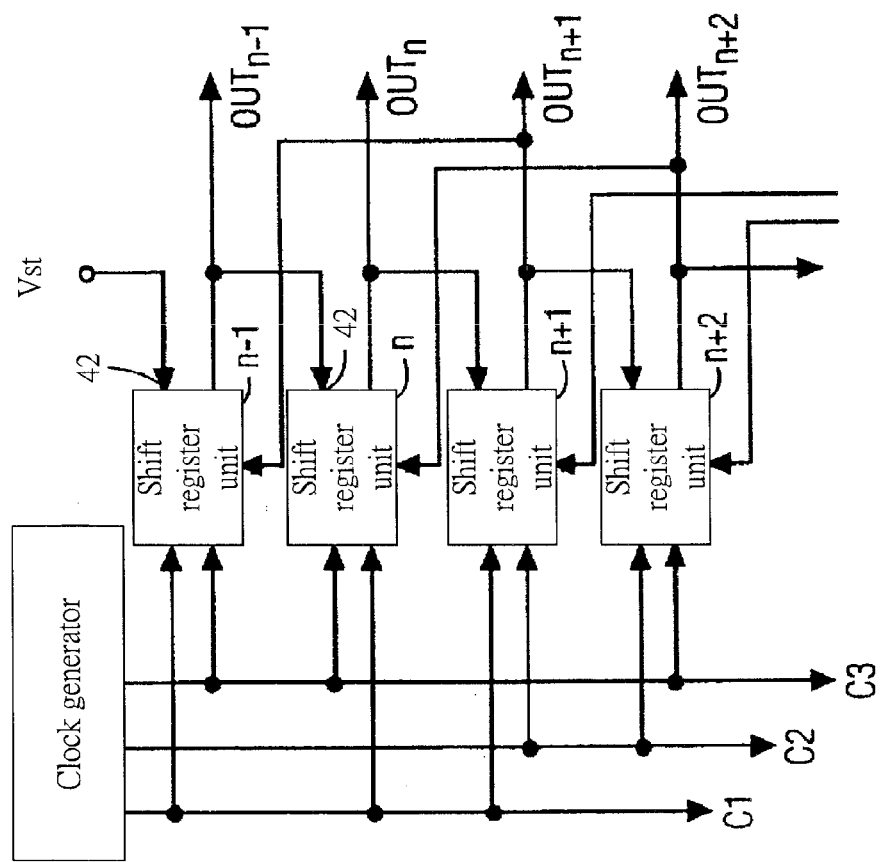
FIG. 6 is a block diagram of the shift register disclosed in U.S. Pat. No. 5,517,542.
Figure 7:
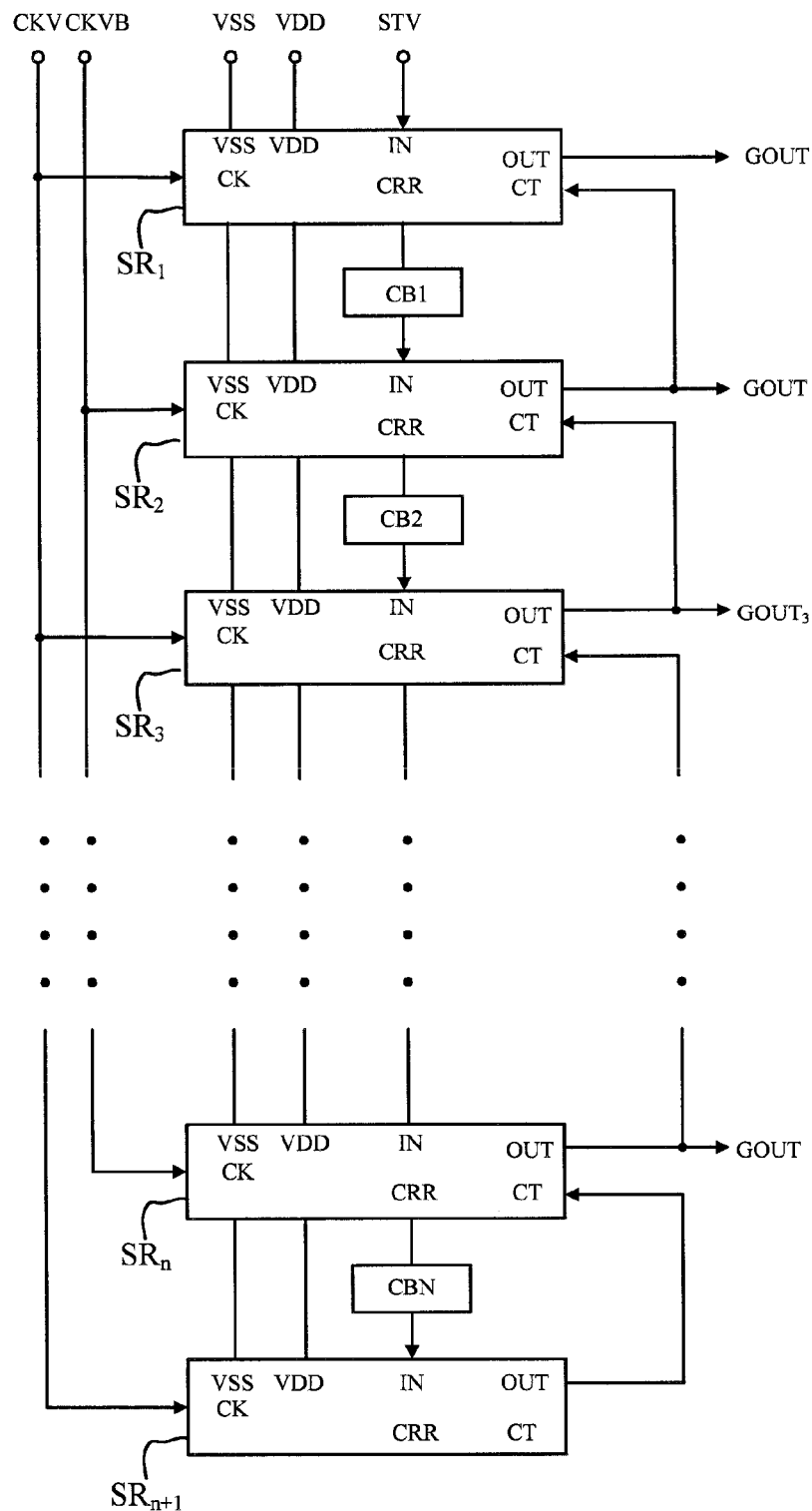
FIG. 7 is a block diagram of the shirt register disclosed in U.S. Pat. No. 6,845,140.
Figure 8:
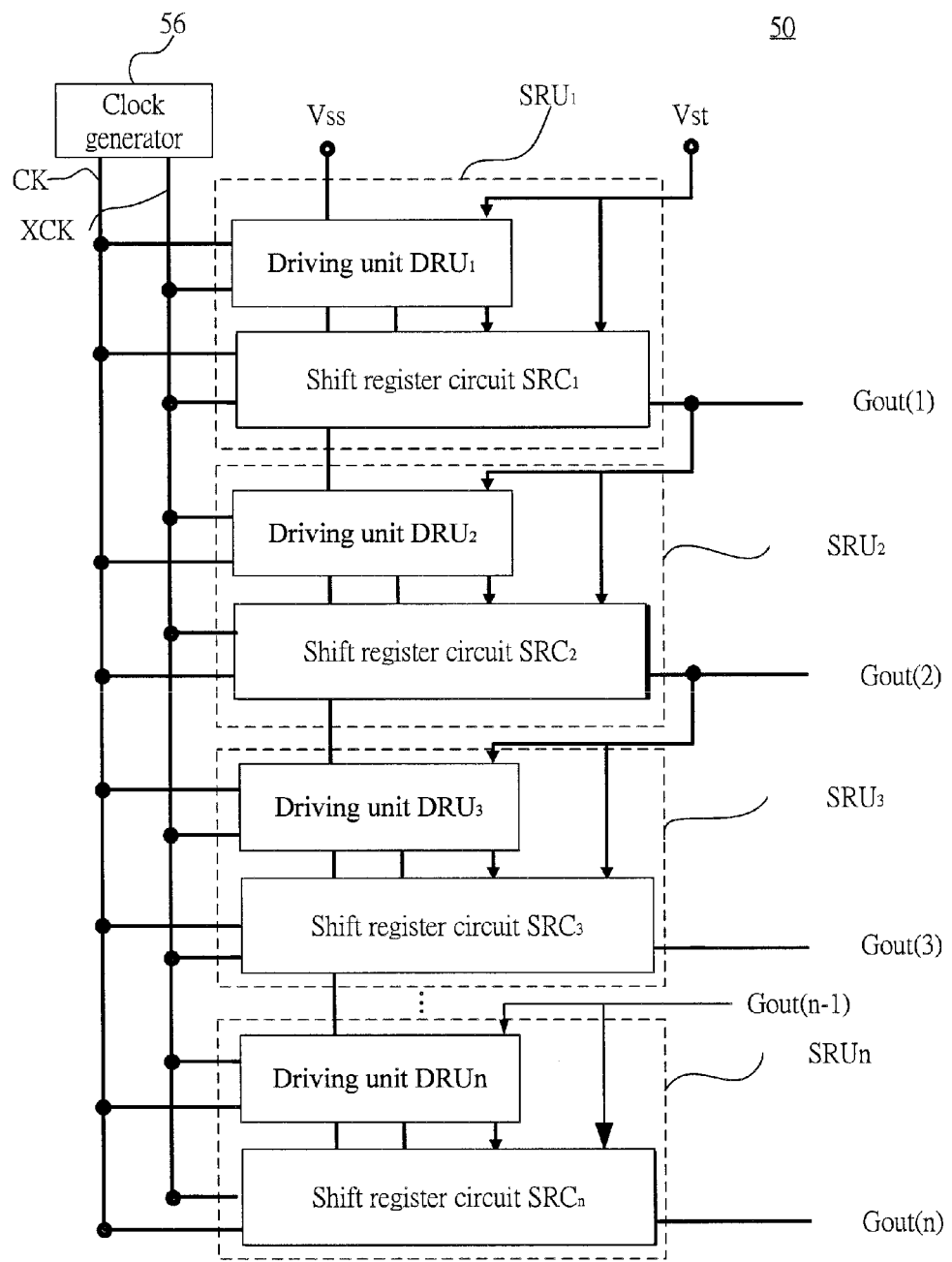
FIG. 8 is a block diagram showing the shift register of the present invention.

FIG. 8 is a block diagram of the shift register 50 according to a preferred embodiment of the present invention. The shift register 50 comprises a plurality of register units $SRU_1$-$SRU_n$, each register unit $SRU_n$ comprises a driving unit $DRU_n$ and a shift register circuit $SRC_n$. While the shift register 50 receives a start trigger pulse Vst, the register unit $SRU_1$ delays the start trigger pulse by a cycle of a first clock signal CK generated by a clock generator 56, and outputs an output pulse at an output end Gout(1). Similarly, each register unit $SRU_n$ delays an output pulse of a previous register unit $SRU_{n-1}$ at output end Gout(n-1) by the cycle of the first clock signal CK or the second clock signal XCK, and outputs an output pulse at output end Gout(n). Noted that a phase of the first clock signal CK is exactly reversed to that of the second clock signal XCK.

Figure 9:
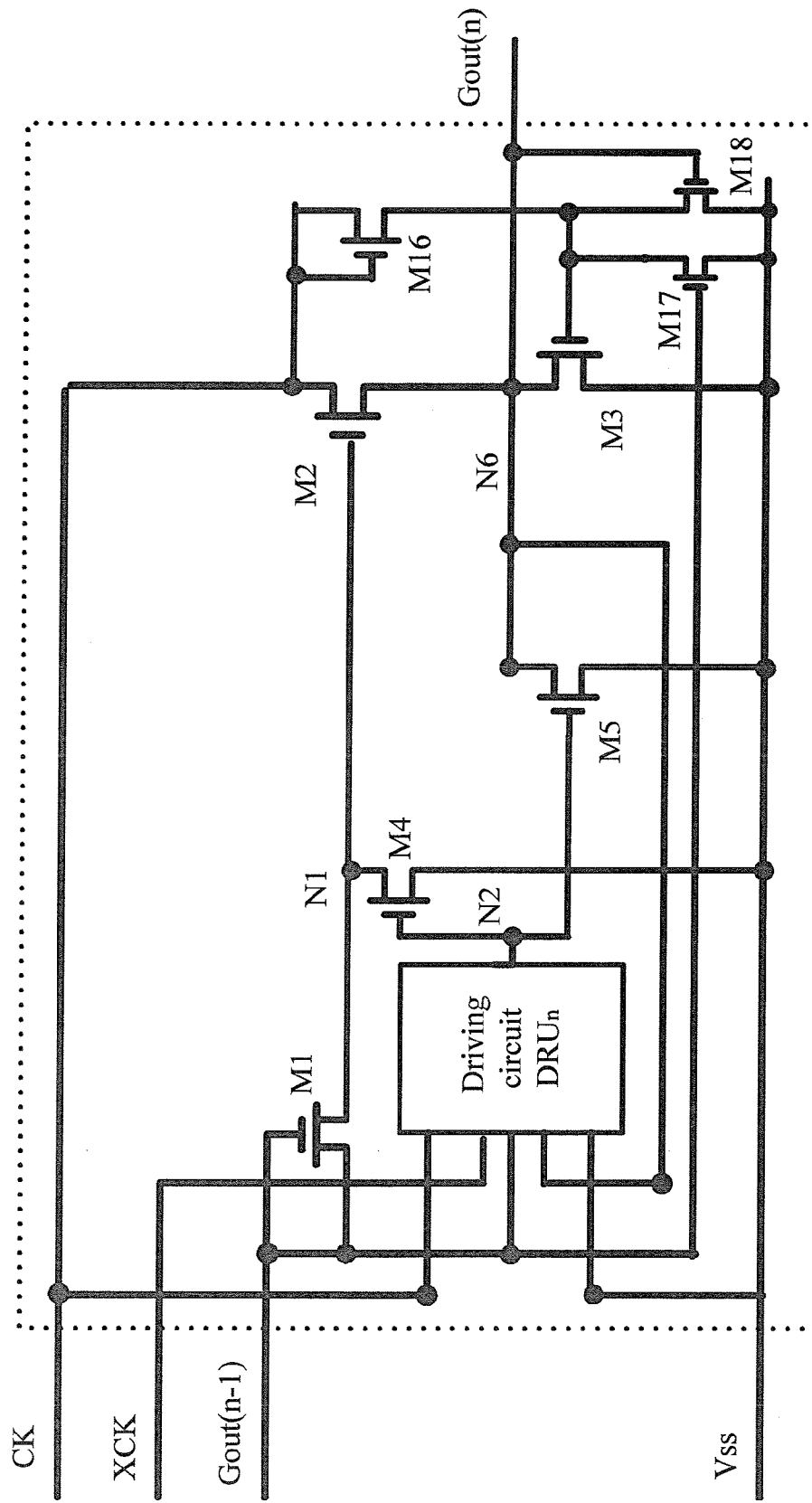
FIG. 9 is a circuit diagram of the register unit as shown in FIG. 8.
Figure 10:
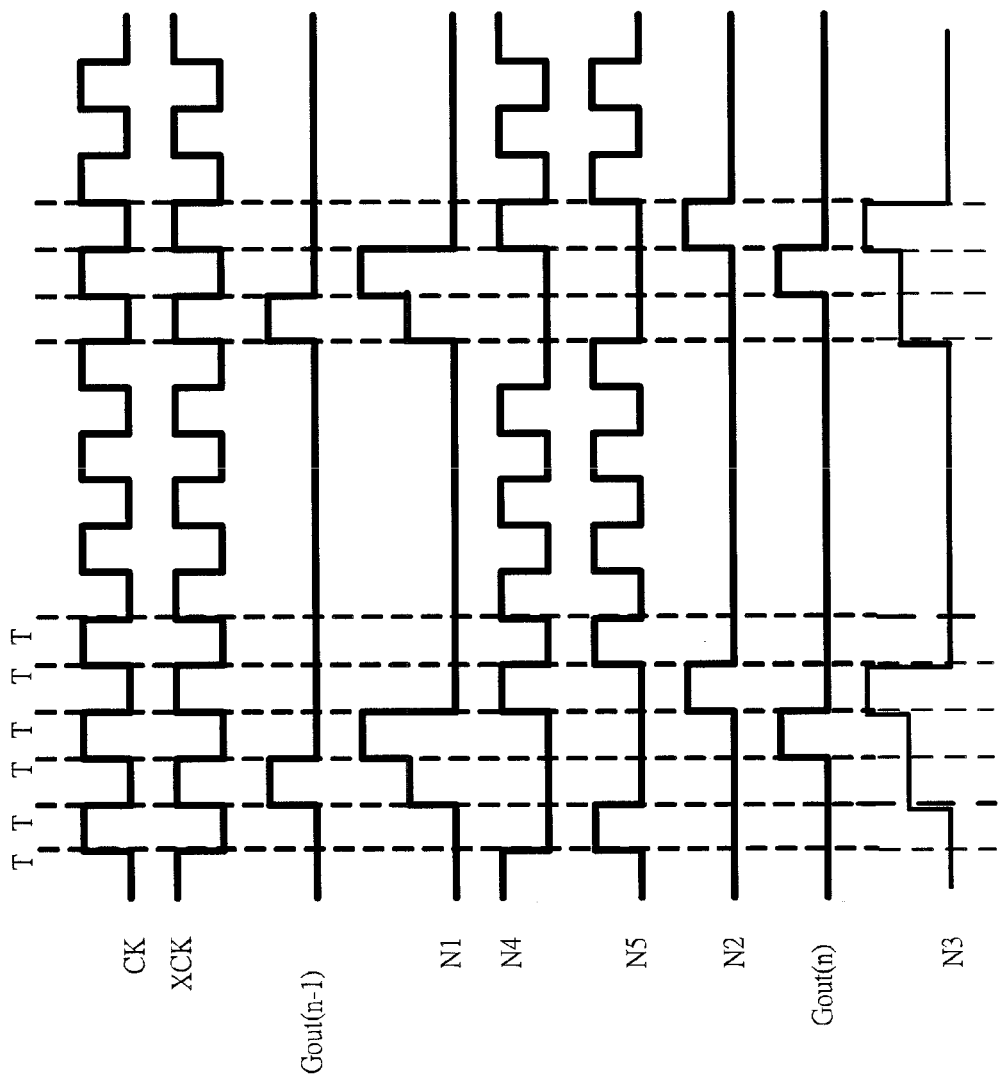
FIG. 10 is a timing diagram of the signals at each node depicted in FIG. 8 and FIG. 9.

Referring to FIGS. 9 and 10, FIG. 9 is a circuit diagram of the register unit as shown in FIG. 8, and FIG. 10 is a timing diagram of the signals at each node depicted in FIG. 8 and FIG. 9. Each shift register circuit $SRC_n$ of each register unit $SRU_n$ comprises a first switch unit M1, a second switch unit M2, a third switch unit M3, a fourth switch unit M4 and a fifth switch unit M5. The switch units M1-M5 can be implemented by transistors. The gate and the source of the first switch unit M1 of the register unit $SRU_n$ electrically coupled to the output end Gout(n-1) of the previous register unit $SRU_{n-1}$, and the drain of the first switch unit M1 electrically coupled the gate of the second switch unit M2. When the output end Gout(n-1) of the previous register unit $SRU_{n-1}$ is at a high voltage level (in a duration of a time period T1-T2), the first switch unit M1 is turned on to cause the node N1 at the high voltage level. During the time period T1-T2, for the gate of the second switch unit M2 is electrically coupled the node N1, and the high voltage level is applied at the node N1, the second switch unit M2 is also turned on, thereby conducting the first clock signal CK to the output end Gout(n). Because the clock signal CK is at the low voltage level, the output end Gout(n) is at the low voltage level as well.

In the time period T2-T3, the output end Gout(n-1) of the previous register unit $SRU_{n-1}$ is at the low voltage level, so that the first switch unit M1 is turned off. Voltage on the node N1 remains at high voltage level due to signal coupling effect, so that the second switch unit M2 still be turn-on. At this time, the first clock signal CK is at the high voltage level, and therefore the output of the output end Gout(n) is at the high voltage level. In the time period T3-T4, because the third switch unit M3 is turned on, the third switch unit M3 conducts a supply voltage Vss with a direct current (DC) low voltage level to the output end Gout(n).

According to the above mentioned mechanism, the input of the register unit $SRU_n$ is at the high voltage level in the time period T1-T2, and then the output end Gout(n) of the register unit $SRU_n$ is at the high voltage level in the period T2-T3, and is at the low voltage level after the time point T3 Accordingly, the register unit $SRU_n$ delays its input by a cycle of clock signal CK.

Figure 11:
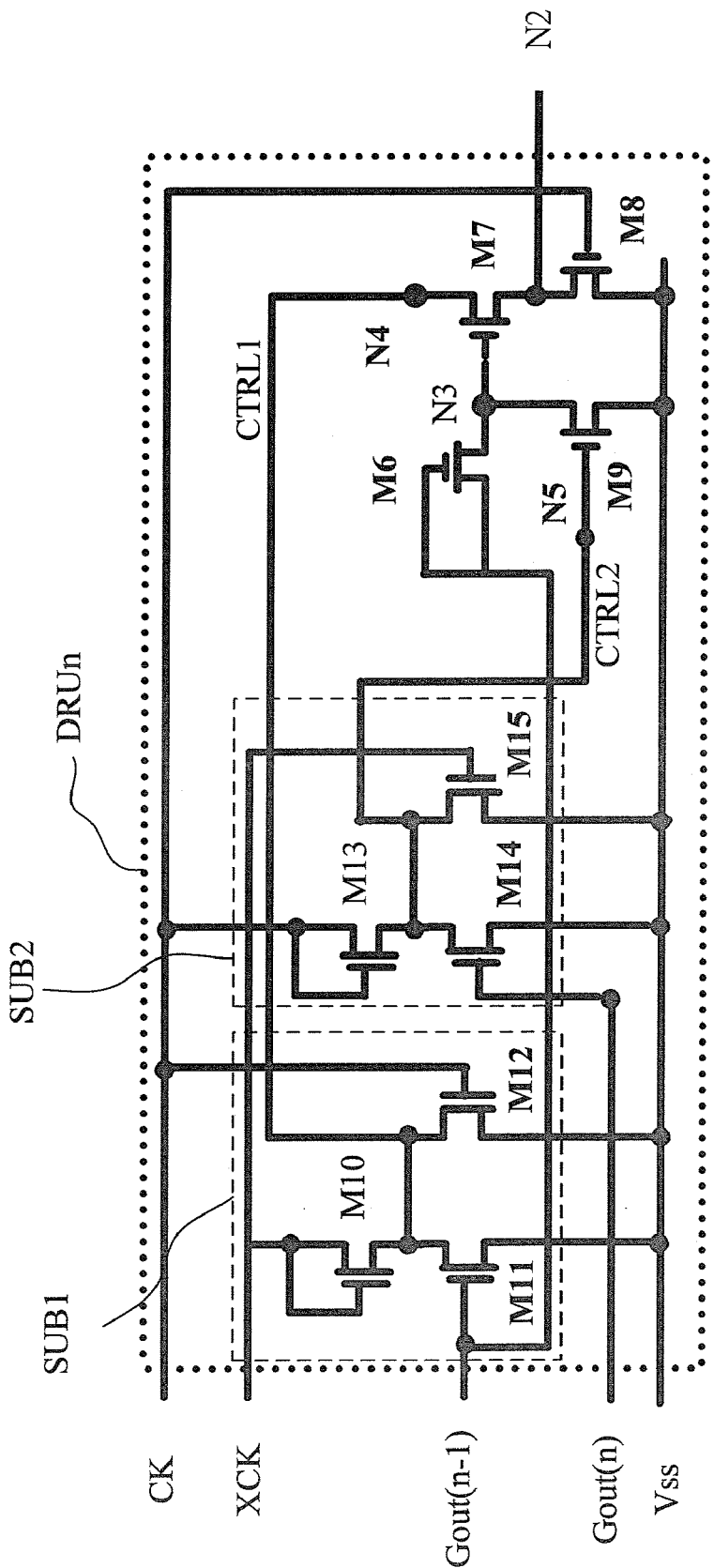
FIG. 11 is a circuit diagram of the driving unit as shown in FIG. 9.

If the high voltage level at the node N1 remains after the time point T3, a shift associated with the threshold voltages of the switch unit M1, M2 may occur. In order to solve such problem, it is necessary to promptly lower the voltage applied at the node N1 to the low voltage level subsequent to the time point T3. Referring to FIGS. 9-11, FIG. 11 is a circuit diagram of the driving unit shown in FIG. 9. The driving unit $DRU_n$ comprises a sixth switch unit M6, a seventh switch unit M7, an eighth switch unit M8, a ninth switch unit M9, a first subtract circuit SUB1, and a second subtract circuit SUB2. The first subtract circuit SUB1 and the second subtract circuit SUB2 are composed of the switch units M10-M12 and the switch units M13-M15 respectively. All the switch units M6-M15 are implemented by transistors. For brevity, the operations of the first subtract circuit SUB1 and the second subtract circuit SUB2, as the one skilled in this art is aware, are omitted. The first subtract circuit SUB1 produces a first modulation signal CTRL1 at the node N4, based on the second clock signal XCK and the output of the output end Gout (n−1) of the previous register unit $SRU_{n-1}$. The second subtract circuit SUB2 produces a second modulation signal CTRL2 at the node N5, based on the first clock signal CK and the output of the output end Gout(n) of the current register unit $SRU_n$. The first modulation signal CTRL1 is a subtraction of the second clock signal XCK and the output of the output end Gout(n−1) of the previous register unit $SRU_{n-1}$, while the second modulation signal CTRL2 is a subtraction of the first clock signal CK and the output of the output end Gout(n) of the current register unit $SRU_n$. Both the gate and the drain of the sixth switch unit M6 are electrically coupled to the output end Gout(n−1) of the previous register unit $SRU_{n-1}$. When the sixth switch unit M6 is turned on by the output pulse of the output end Gout(n−1) of the previous register unit $SRU_{n-1}$ during time period T1-T2, the output pulse is conducted by the sixth switch unit M6 to cause the voltage of the node N3 to be at the high voltage level. Meanwhile, because the gate of the ninth switch unit M9 is controlled by the second modulation signal CTRL2 (at the node N5) generated by the second subtract circuit SUB2, the ninth switch unit M9 will turn on after the time point T4. In the time period T1-T4, the gate of the seventh switch unit M7 electrically coupled to the node N3 is at the state of the high voltage level, so the seventh switch unit M7 is turned on. In the time period T3-T4, because the first modulation signal CTRL1 at the node N4 is at the high voltage level, the seventh switch unit M7 turns on and conducts the high voltage level to the node N2. In the time period T4-T5, for the first clock signal CK and the second modulation signal CTRL2 are at the high voltage level, the eight switch unit M8 and the ninth switch unit M9 turns on respectively, so that the voltage at the node N2 and the node N3 become the low voltage level due to the supply voltage Vss.

The driving unit $DRU_n$ outputs a driving pulse in the time period T3-T4. Therefore, the fourth switch unit M4 is turned on, and the voltage at the node N1 lowers to the low voltage level. After the register unit $SRU_n$ produces the output pulse to output end Gout(n) in the time period T2-T3, the fourth switch unit M4 turns on in the time period T3-T4, causing the voltage at node N1 at low voltage level. In doing so, the gate of the second switch unit M2 will not be at high voltage level after the time point T3, preventing from voltage stress effect which may damage the lifetime of the transistor.

Similarly, the driving pulse of the driving unit $DRU_n$ can turn on the fifth switch unit M5 in the time period T3-T4, to ensure the output end Gout(n) keeps at low voltage level which is provided by the supply voltage Vss after the time point T3.

Preferably, the shift register of this embodiment functions as a gate driver of a liquid crystal display.

Accordingly, the shift register of the present invention provides a driving unit capable of generating a driving pulse in response to the input pulse, so that the gate of the second switch unit M2 does not keep the high voltage level for a long while, thereby reducing the voltage stress effect for a transistor. In doing so, not only the lifetime of the switch unit M2 is prolonged, but also the performance of the shift register does not degrade, as well as the lifetime of the shift register increases. In addition, the present invention driving unit generates a driving pulse in response to a start trigger pulse, instead of a feedback of following register unit, to control the fourth switch unit M4 turning on in time, so that the gate of the second switch unit M2 does not keep the high voltage level for a long while.

While the invention has been described by way of example and in terms of the preferred embodiments, it is to be understood that the invention is not limited to the disclosed embodiments. To the contrary, it is intended to cover various modifications and similar arrangements

What is claimed is:

1. A shift register, comprising:
   n register units electrically coupled in cascade, where n is equal to or greater than 3, each register unit outputting an output pulse according to a first clock signal, a second clock signal, and an input pulse, wherein the input pulse of a first one of the n register units comprises a start trigger pulse, and wherein the input pulse of the second to the $n^{th}$ register units comprises the output pulse of a preceding one of the first to the $(n-1)^{th}$ register units, respectively, each register unit comprising:
   a first switch unit for conducting the input pulse to a first node when the first switch unit is turned on;
   a second switch unit for conducting the first clock signal to an output end to generate the output pulse when the second switch unit is turned on in response to the input pulse;
   a third switch unit for conducting a supply voltage to the output end when the second switch unit is turned off;
   a fourth switch unit, electrically coupled to a supply end, for conducting the supply voltage to the first node when the fourth switch unit is turned on in response to a driving pulse; and
   a driving unit for providing the driving pulse according to the first clock signal, the second clock signal, and the input pulse, the driving unit comprising:
      a first subtract circuit for producing a first modulation signal according to the second clock signal and the input pulse;

a second subtract circuit for producing a second modulation signal according to the first clock signal and the output pulse;

a sixth switch unit electrically connected to the first subtract circuit for conducting the input pulse to a third node when the sixth switch unit is turned on;

a seventh switch unit electrically connected to the third node for conducting the first modulation signal to a second node to generate the driving pulse when the seventh switch unit is turned on;

an eighth switch unit electrically coupled to the supply end and the second node, for conducting the supply voltage to the second node when the seventh switch unit is turned off; and a ninth switch unit electrically coupled to the supply end and the third node, for conducting the supply voltage to the third node when the ninth switch unit is turned on according to the second modulation signal.

2. The shift register according to claim 1, wherein a phase of the first clock signal is reversed to a phase of the second clock signal.

3. The shift register according to claim 1, further comprising:

a fifth switch unit electrically coupled to the supply end, for conducting the supply voltage to the output end when the fifth switch unit is turned on in response to the driving pulse.

4. The shift register according to claim 3, wherein at least one of the first, second, third, fourth, and fifth switch units comprises a transistor.

5. The shift register according to claim 1, wherein the sixth, seventh, eighth, and ninth switch units are implemented by transistors.

6. A liquid crystal display incorporating the shift register according to claim 1.

7. A register unit for delaying an input pulse received at an input end and outputting an output pulse at an output end, comprising:

a first switch unit for conducting the input pulse to a first node when the first switch unit is turned on;

a second switch unit for conducting a first clock signal to the output end to generate the output pulse when the second switch unit is turned on in response to the input pulse;

a third switch unit, electrically coupled to a supply end, for conducting a supply voltage to the output end when the second switch unit is turned off;

a fourth switch unit, electrically coupled to a supply end, for conducting the supply voltage to the first node when the fourth switch unit is turned on in response to a driving pulse;

a fifth switch unit electrically coupled to the supply end, for conducting the supply voltage to the output end when the fifth switch unit is turned on in response to the driving pulse; and a driving unit for providing the driving pulse to turn on the fourth switch unit according to the first clock signal, a second clock signal, and the input pulse, the driving unit comprising:

a first subtract circuit for producing a first modulation signal according to the second clock signal and the input pulse;

a second subtract circuit for producing a second modulation signal according to the first clock signal and the output pulse;

a sixth switch unit electrically connected to the first subtract circuit for conducting the input pulse to a third node when the sixth switch unit is turned on;

a seventh switch unit electrically connected to the third node for conducting the first modulation signal to a second node to generate the driving pulse when the seventh switch unit is turned on;

an eighth switch unit electrically coupled to the supply end and the second node, for conducting the supply voltage to the second node when the seventh switch unit is turned off: and a ninth switch unit electrically coupled to the supply end and the third node, for conducting the supply voltage to the third node when the ninth switch unit is turned on according to the second modulation signal.

8. The register unit according to claim 7, wherein a phase of the first clock signal is reversed to a phase of the second clock signal.

9. The register unit according to claim 7, wherein at least one of the first, second, third, fourth and fifth switch units comprises a transistor.

10. The register unit according to claim 7, wherein at least one of the sixth, seventh, eighth, and ninth switch units comprises a transistor.

11. The register unit according to claim 7, wherein the input pulse comprises a start trigger pulse.

* * * * *